United States Patent [19]

Lode

[11] Patent Number: 5,536,617
[45] Date of Patent: Jul. 16, 1996

[54] METHOD FOR MAKING A LITHOGRAPHIC PRINTING PLATE

[75] Inventor: Deprez Lode, Wachtebeke, Belgium

[73] Assignee: AGFA-Gevaert, N.V., Mortsel, Belgium

[21] Appl. No.: 304,474

[22] Filed: Sep. 12, 1994

[30] Foreign Application Priority Data

Sep. 21, 1993 [EP] European Pat. Off. .............. 93202728

[51] Int. Cl.$^6$ ................................. G03C 8/36; G03F 7/07
[52] U.S. Cl. .......................... 430/204; 430/248; 101/466
[58] Field of Search ..................................... 430/204, 248, 430/264, 302; 101/466

[56] References Cited

U.S. PATENT DOCUMENTS

| | | | |
|---|---|---|---|
| 3,083,097 | 3/1963 | Lassig et al. | 430/204 |
| 3,161,508 | 12/1964 | Hepher et al. | 430/204 |
| 3,822,127 | 7/1974 | Tsuboi et al. | 430/204 |
| 4,443,531 | 4/1984 | Yamada et al. | 430/204 |
| 5,196,290 | 3/1993 | Coppens et al. | 430/204 |
| 5,200,294 | 4/1993 | De Keyzer et al. | 430/204 |
| 5,283,156 | 2/1994 | Monbaliu et al. | 430/204 |
| 5,413,897 | 5/1995 | Van Rompoy et al. | 430/204 |

*Primary Examiner*—Richard L. Schilling
*Attorney, Agent, or Firm*—Breiner & Breiner

[57] ABSTRACT

The present invention provides a method for making a lithographic printing plate according to the silver salt diffusion transfer process comprising the steps of:

image-wise exposing an imaging element comprising on a support a photosensitive layer comprising a silver halide emulsion and an image receiving layer containing physical development nuclei, developing said imaging element in the presence of developing agent(s) and silver halide solvent(s) using an alkaline processing liquid and treating the thus obtained developed imaging element using a finishing liquid having a pH of at least 8.5 being substantially free of oxidizing compounds.

Less useless copies are generated at the start of the printing process using a printing plate obtained according to the method of the present invention.

3 Claims, No Drawings

METHOD FOR MAKING A LITHOGRAPHIC PRINTING PLATE

DESCRIPTION

1. Field of the Invention

The present invention relates to a method for making a lithographic printing plate according to the silver salt diffusion transfer process.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background. For example, typical lithographic printing plates are disclosed e.g. EP-A-423399 and EP-A-410500.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

As for other printing plates it is required that the printing plates obtained according to the DTR-process have a high printing endurance, good ink acceptance in the printing areas and no ink acceptance in the non-printing areas (no staining). It is furthermore desirable, especially for low printing runs, that the number of copies that have to be disposed of because of poor ink acceptance in the printing areas and/or ink acceptance in the non-printing areas during start-up of the printing process is limited. Besides the above requirements the printing plate preferably exhibits a high resolving power.

In e.g. DE-A-2,019,995, FR-A-1,582,133 and FR-A-1,582,235 it has been proposed to treat a developed monosheet DTR-material with a finishing liquid having a neutral or alkali pH and containing an oxidizing agent such as $K_3Fe(CN)_6$ and a hydrophobizing compound, doing away with the necessity of a lacquer. However, oxidizing compounds are ecological objectionable substances because they are dangerous, therefore inconvenient to handle and harmful for the environment.

In EP-A 590,204 it has been proposed to treat a developed monosheet DTR-material with a finishing liquid having a pH less than 7 and containing a meso-ionic compound. A reduction in the number of copies that have to be disposed of and an increase of the resolution was found. However, the meso-ionic compounds are expensive and the achieved result is still unsatisfactory.

Finishing liquids having a pH around 5.6 containing cysteine have also been used to obtain the objective of decreasing the number of useless copies during startup. Although such finishing liquids are effective, they have a inherent low stability and need to be refreshed frequently.

3. SUMMARY OF THE INVENTION

It is an object of the present invention to provide a method for making a lithographic printing plate according to the DTR-process having good printing properties i.e. good ink acceptance in the printing areas, no ink acceptance in the non-printing areas and a good resolving power, that uses an ecological acceptable and cheap finishing solution.

Further objects of the present invention will become clear from the description hereinafter.

According to the present invention there is provided a method for making a lithographic printing plate according to the silver salt diffusion transfer process comprising the steps of:

- image-wise exposing an imaging element comprising on a support a photosensitive layer comprising a silver halide emulsion and an image receiving layer containing physical development nuclei,
- developing said imaging element in the presence of developing agent(s) and silver halide solvent(s) using an alkaline processing liquid and
- treating the thus obtained developed imaging element using a finishing liquid having a pH of at least 8.5 being substantially free of oxidizing compounds.

4. DETAILED DESCRIPTION OF THE INVENTION

It has been found that a lithographic printing plate prepared according to the DTR-process and treated with a finishing liquid having a pH of at least 8.5, the number of copies that have to be disposed of during startup can be decreased. This result can be obtained without the addition of special compounds such as an oxidizing compounds, a meso-ionic compound or cysteine.

A finishing liquid substantially free of oxidizing compounds according with the present invention is a finishing liquid containing less than 5 g/l of an oxidizing compounds. Preferably said finishing liquid contains less than 0.5 g/l, even more preferably less than 0.05 g/l, most preferably less than 0.001 g/l of an oxidizing compound.

A finishing liquid in accordance with the present invention preferably has a pH between 8.5 and 11. The finishing liquid preferably contains a buffer e.g. a phosphate buffer, a citrate buffer, a carbonate buffer, borate buffer or mixtures thereof. The liquid may contain substances which influence the hydrophobic/hydrophilic balance of the printing plate obtained after processing of the DTR element, e.g. silica. Further the finishing solution can contain wetting agents, preferably compounds containing perfluorinated alkyl groups.

The alkaline processing liquid used for developing the imaging element in accordance with the method of the present invention preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones, thiocyanates and thiosulfates. Further silver halide solvents that can be used in connection with the present invention are alkanolamines.

Alkanolamines that are suitable for use in accordance with the present invention may be of the tertiary, secundary or primary type. Examples of alkanolamines that may be used in connection with the present invention correspond to the following formula:

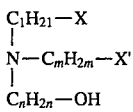

wherein X and X' independently represent hydrogen, a hydroxyl group or an amino group, 1 and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol etc. or fixtures thereof.

According to the present invention the alkanolamines are preferably present in the alkaline processing liquid in a concentration preferably between 0.1% and 10% by weight. However part or all of the alkanolamine can be present in one or more layers of the imaging element.

A further suitable type of silver halide solvents are thioether compounds. Preferably used thioethers correspond to the following general formula:

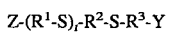

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10.

Examples of thioether compounds corresponding to the above formula are disclosed in e.g. U.S. Pat. No. 4,960,683 and specific examples are listed in table 2

TABLE 2

| | |
|---|---|
| $(HO-CH_2-CH_2)_2S$ | 1 |
| $HO-CH_2-CH_2-S-CH_2-S-CH_2-CH_2-OH$ | 2 |
| $HO-CH_2-CH_2-S-(CH_2)_2-S-CH_2-CH_2-OH$ | 3 |
| $HO-CH_2-CH_2-S-(CH_2)_3-S-CH_2-CH_2-OH$ | 4 |
| $HO-CH_2-CH_2-S-(CH_2)_4-S-CH_2-CH_2-OH$ | 5 |
| $C_2H_5-S-CH_2-CH_2-S-CH_2-CHOH-CH_2-OH$ | 6 |
| $(HOCH_2-CH_2-S-CH_2-CH_2)_2O$ | 7 |
| $HO-CH_2-CH_2-S-CH_2-CH_2-N(CH_3)_2$ | 8 |
| $(HO-CH_2-CHOH-CH_2-S-CH_2)_2$ | 9 |
| $HOOC-CH_2-S-CH_2-S-CH_2-COOH$ | 10 |
| $HOOC-CH_2-S-(CH_2)_2-S-CH_2-COOH$ | 11 |
| $HOOC-CH_2-S-(CH_2)_3-S-CH_2-COOH$ | 12 |
| $HOOC-(CH_2)_2-S-CH_2-S-(CH_2)_2-COOH$ | 13 |
| $HOOC-(CH_2)_2-S-(CH_2)_2-S-(CH_2)_2-COOH$ | 14 |
| $HOOC-(CH_2)_2-S-(CH_2)_3-S-(CH_2)_2-COOH$ | 15 |
| $CH_3-S-CH_2-CH_2-\underset{\underset{NH_2}{\mid}}{CH}-COOH$ | 16 |

According to the present invention the alkaline processing and/or finishing liquid preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms, preferably at least 5 carbon atoms. Examples of hydrophobizing agents for use in accordance with the present invention are e.g. those described in U.S. Pat. No. 3,776,728, and U.S. Pat. No. 4,563,410.

According to the present invention the hydrophobizing agents are contained in the alkaline processing liquid or the finishing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc.. Typically the concentration of hydrophobizing agent is preferably not more than 1.5 g/l and more preferably not more than 1 g/l.

According a particularly preferred embodiment in connection with the present invention the alkaline processing liquid contains a meso-ionic compound as a regulating compound. Meso-ionic compounds as referred to in the present invention are a group of compounds defined by W. Baker and W. D. Ollis as "5- or 6-membered heterocyclic compounds which cannot be represented satisfactorily by any one covalent or polar structure and possesses a sextet of π-electrons in association with the atoms comprising the ring. The ring bears a fractional positive charge balanced by a corresponding negative charge located on a covalently attached atom or group of atoms" as described in *Quart. Rev.*, Vol. 11, p. 15 (1957) and *Advances in Heterocyclic Chemistry*, Vol. 19, P. 4 (1976).

Preferred meso-ionic compounds are those represented by formula (I):

$$M^+—A^- \qquad (I)$$

wherein M represents a 5- or 6-membered heterocyclic ring composed of at least one member selected from the group consisting of a carbon atom, a nitrogen atom, an oxygen atom, a sulfur atom and a selenium atom; and $A^-$ represents $—O^-$, $—S^-$ or $—N^-—R$, wherein R represents an alkyl group (preferably having 1 to 6 carbon atoms), a cycloalkyl group (preferably having 3 to 6 carbon atoms), an alkenyl group (preferably having 2 to 6 carbon atoms) an alkynyl group (preferably having 2 to 6 carbon atoms), an aralkyl group, an aryl group (preferably having 6 to 12 carbon atoms), or a heterocyclic group (preferably having 1 to 6 carbon atoms).

In formula (I), examples of the 5-membered heterocyclic ring as represented by M include an imidazolium ring, a pyrazolium ring, an oxazolium ring, an isoxazolium ring, a thiazolium ring, an isothiazolium ring, a 1,3-dithiol ring, a 1,3,4- or 1,2,3 oxadiazolium ring, a 1,3,2-oxathiazolium ring, a 1,2,3-triazolium ring, a 1,3,4-triazolium ring, a 1,3,4-, 1,2,3- or 1,2,4-thiadiazolium ring, a 1,2,3,4-oxatriazolium ring, a 1,2,3,4-tetrazolium ring and a 1,2,3,4-thiatriazolium ring.

Preferred meso-ionic compounds for use in accordance with the present invention are triazolium thiolates and more preferably 1,2,4-triazolium-3-thiolates and most peferably those that correspond to the following formula:

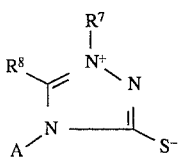

wherein $R^7$ and $R^8$ each independently represents an alkyl group, alkenyl group, cycloalkyl group, aralkyl group, aryl group or heterocyclic group each of which groups may be substituted or not, A represents an alkyl group, alkenyl group, cycloalkyl group, aralkyl group, aryl group, heterocyclic group each of which groups may be substituted or represents $-NR^9R^{10}$ wherein $R^9$ and $R^{10}$ each independently represents hydrogen, a substituted or unsubstituted alkyl group or a substituted or unsubstituted aryl group or wherein $R^7$ and $R^8$ or $R^8$ and A or $R^9$ and $R^{10}$ together with the atoms to which they are attached represent the necessary atoms to form a 5- or 6-membered ring.

Specific examples of 1,2,4-triazolium-3-thiolates suitable for use in accordance with the present invention are shown in table 1.

TABLE 1

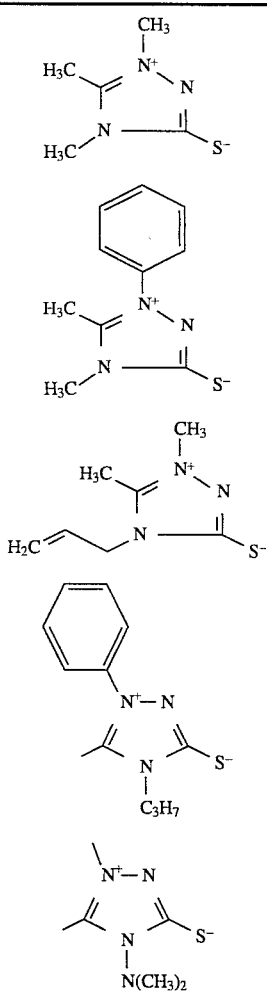

TABLE 1-continued

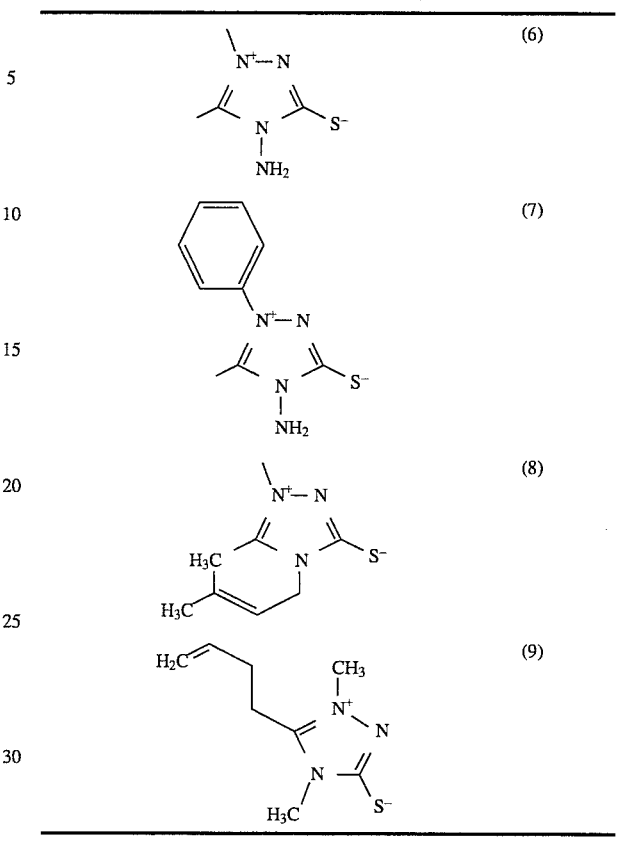

According to a preferred embodiment of the present invention at least part and most preferably all of the meso-ionic compound is preferably present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. This offers the advantage of replenishment of said meso-ionic compound in the alkaline processing liquid. Preferably the meso-ionic compound is incorporated in a layer of the imaging element that does not contain silver halide such as e.g. in a backing layer, in the image receiving layer, a subbing layer etc.. The meso-ionic compound is preferably contained in the imaging element in a total amount between 0.1 and 10 mmol/m² more preferably between 0.1 and 0.5 mmol/m² and most preferably between 0.5 and 1.5 mmol/m².

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc.. Suitable organic alkaline substances are e.g. alkanolamines. In the latter case the alkanolamines will provide or help maintain the pH and serve as a silver halide complexing agent.

The alkaline processing liquid may also contain the developing agent(s) used in accordance with the present invention. In this case the alkaline processing liquid is called a developer. On the other hand some or all of the developing agent(s) may be present in one or more layers of the imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

Development acceleration can be accomplished with the aid of various compounds to the alkaline processing liquid and/or one or more layers of the photographic element, preferably polyalkylene derivatives having a molecular weight of at least 400 such as those described in e.g. U.S. Pat. Nos. 3,038,805 - 4,038,075 - 4,292,400 - 4,975,354.

According to the present invention the imaging element can be information-wise exposed in an apparatus according to its particular application, e.g. a conventional process camera containing a conventional light source or a laser containing device.

The imaging element in connection with the present invention for preparing a lithographic printing plate essentially contains on a support a photosensitive layer containing silver halide and an image receiving layer containing physical development nuclei.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly-(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used in accordance with the present invention.

The image receiving layer containing physical development nuclei used in accordance with the present invention is preferably free of hydrophilic binder but may comprise small amounts upto 30% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride while a fraction of silver bromide may be present ranging from 1 mole % to 40 mole %. The emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 μm, preferably from 0.25 to 0.45 μm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building in in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The spectral sensitizers can be added to the photographic emulsions in the form of an aqueous solution, a solution in an organic solvent or in the form of a dispersion.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The silver halide emulsions may contain pH controlling ingredients. Preferably the emulsion layer is coated at a pH value below the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787, DE-P 2,453,217.

In an especially preferred embodiment the emulsion layer contained in the imaging element contains a compound which comprises in its molecular structure a group capable of adsorbing to silver halide and a group capable of reducing silver halide. Compounds of this kind have been disclosed in EP-A-449340. In this way a combination of a stabilizing and a development activating function in one compound is achieved.

More details about the composition, preparation and coating of silver halide emulsions can be found in e.g. Product Licensing Index, Vol. 92, December 1971, publication 9232, p. 107–109.

In addition to the above described emulsion layer and image receiving layer other hydrophilic colloid layers in water permeable relationship with these layers may be present. For example it is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivety, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value below the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, methylenebis(sulfonylethylene), chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present invention may further comprise various kinds of surface-active agents in the photographic emulsion layer or in at least one other hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Preferably compounds containing perfluorinated alkyl groups are used. Such surface-active agents can be used for various purposes e.g. as coating aids, as compounds preventing electric charges, as compounds improving slidability, as compounds facilitating dispersive emulsification and as compounds preventing or reducing adhesion.

The photographic material of the present invention may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth)acrylates, sulphoalkyl (meth)acrylates, and styrene sulphonic acids.

The present invention will now be illustrated by the following examples without however limiting it thereto. All parts are by weight unless otherwise specified.

EXAMPLE

Preparation of the silver halide emulsion coating solution.

A silver chlorobromide emulsion composed of 98.2 mol % of chloride and 1.8 mol % of bromide was prepared by the double jet precipitation method. The average silver halide grain size was 0.4 µm (diameter of a sphere with equivalent volume) and contained Rhodium ions as internal dopant. The emulsion was orthochromatically sensitized and stabilized by a 1-phenyl-5-mercapto-tetrazole.

A base layer coating solution was prepared having the following composition:

| gelatin | 5.5% |
| carbon black | 0.76% |
| silica particles (5 µm) | 1.6% |

Preparation of the imaging element:

The emulsion coating solution and base layer coating solution were simultaneously coated by means of the cascade coating technique to a polyethylene terephthalate support provided with a pack of two backing layers such that the base layer coating was coated directly to the side of the support opposite to the side containing said backing layers. The emulsion layer was coated such that the silver halide coverage expressed as $AgNO_3$ was 1.5 g/m$^2$ and the gelatin content was 1.5 g/m$^2$. The emulsion layer further contained 0.15 g/m$^2$ of of 1-phenyl-4,4'-dimethyl-3-pyrazolidone and 0.25 g/m$^2$ of hydroquinone. The base layer was coated such that the amount of gelatin in the coated layer was 3 g/m$^2$.

The layer nearest to the support of the backing layer pack contained 0.3 g/m$^2$ of gelatin and 0.5 g/m$^2$ of the antistatic agent co(tetraallyloxyethane/methacrylate/acrylic acid-K-salt) polymer. The second backing layer contained 4 g/m$^2$ of gelatin, 0.15 g/m$^2$ of a matting agent consisting of transparent spherical polymeric beads of 3 micron average diameter according to EP 0080225, 0.05 g/m$^2$ of hardening agent triacrylformal and 0.021 g/m$^2$ of wetting agent $F_{15}C_7$-COONH$_4$.

The thus obtained element was dried and subjected to a temperature of 40° C. for 5 days and then the emulsion layer was overcoated with a layer containing PdS as physical development nuclei, hydroquinone at 0.4 g/m$^2$ and formaldehyde at 100 mg/m$^2$.

The following alkaline processing solution was prepared:

| | |
|---|---|
| sodium hydroxide (g) | 30 |
| sodium sulphite anh. (g) | 35 |
| compound 3 of table 1 (g) | 1.1 |
| 2-aminoethyl-aminoethanol (ml) | 30 |
| 2-mercapto-5-n.heptyl-oxa-3,4-diazole (mg) | 225 |
| water to make | 1000 ml |

The following finishing liquids were prepared:

TABLE 1

| Sample no. | Buffer* | pH** |
|---|---|---|
| 1 | Na$_3$PO$_4$ | 7 |
| 2 | Na$_2$B$_4$O$_7$ | 9 |
| 3 | NaHCO$_3$ | 10 |

*the buffer was added in an amount of 0.14 mol/l
**the pH was adjusted using NaOH and/or H$_2$SO$_4$ Three imaging elements prepared as described above were developed using the alkaline processing liquid and were then each treated with one of the finishing liquids described in table 1. Each of the obtained printing plates was then mounted on a printing machine operating with a conventional ink and the following dampening liquid:

| | |
|---|---|
| water | 880 ml |
| citric acid | 6 g |
| boric acid | 8.4 g |
| sodium sulphate anh. | 25 g |
| ethyleneglycol | 100 g |
| colloidal silica | 28 g |

The plates were evaluated for the number of copies that had to be disposed of at the start of the printing process because of poor quality. It was found that the number of useless copies in case the finishing liquid 1 was used, was more than 100 whereas in case the other two finishing liquids 2 and 3 were used the number was 50 or less.

I claim:

1. A method for making a lithographic printing plate according to the silver salt diffusion transfer process comprising the steps of:

image-wise exposing an imaging element comprising on a support a photosensitive layer comprising a silver halide emulsion and an image receiving layer containing physical development nuclei, developing said imaging element in the presence of developing agent(s) and silver halide solvent(s) using an alkaline processing liquid and treating the thus obtained developed imaging element using a finishing liquid, wherein said alkaline processing liquid and/or said finishing liquid comprise(s) a hydrophobizing agent and said finishing liquid has a pH between 8.5 and 11, is buffered by means of phosphate, borate or carbonate and is substantially free of oxidizing compounds.

2. A method according to claim 1 wherein said finishing liquid further comprises said hydrophobizing agent.

3. A method according to claim 1 wherein said alkaline processing liquid comprises a meso-ionic compound.

* * * * *